United States Patent [19]

Sawae et al.

[11] Patent Number: 4,782,202

[45] Date of Patent: Nov. 1, 1988

[54] METHOD AND APPARATUS FOR RESISTANCE ADJUSTMENT OF THICK FILM THERMAL PRINT HEADS

[75] Inventors: Tetsunori Sawae; Hiromi Yamashita; Takafumi Endo; Kohei Katayama; Yukio Murata, all of Hyogo, Japan

[73] Assignee: Mitsubishi Denki Kabushiki Kaisha, Tokyo, Japan

[21] Appl. No.: 946,968

[22] Filed: Dec. 29, 1986

[51] Int. Cl.[4] .......................... H01L 49/00; B41J 3/20

[52] U.S. Cl. .................................... 219/68; 29/610.1; 219/216; 437/172

[58] Field of Search ................ 219/68, 69 R, 216 PH, 219/69 P; 338/195; 346/76 PH; 400/120; 437/170, 172, 918; 324/63.64; 29/610 R

[56] References Cited

U.S. PATENT DOCUMENTS

| | | | |
|---|---|---|---|
| 881,010 | 3/1908 | Krannichfeldt | 29/610 R |
| 3,261,082 | 7/1966 | Maissel et al. | 29/610 R |
| 3,308,528 | 3/1967 | Bullard et al. | 29/610 R |
| 3,333,326 | 8/1967 | Thomas, Jr. et al. | 437/918 |
| 3,388,461 | 6/1968 | Lins | 29/610 R |
| 3,548,303 | 12/1970 | Helgeland | 29/610 R |
| 4,210,996 | 7/1980 | Amemiya et al. | 29/610 R |
| 4,570,332 | 2/1986 | Yamauchi | 437/170 |
| 4,606,781 | 8/1986 | Vyne | 437/170 |
| 4,705,931 | 11/1987 | Di Mino | 219/68 |

FOREIGN PATENT DOCUMENTS

| | | | |
|---|---|---|---|
| 149829 | 7/1981 | German Democratic Rep. | 29/610 R |
| 162064 | 9/1984 | Japan | 219/216 |
| 192666 | 10/1985 | Japan | 219/216 |
| 902084 | 1/1982 | U.S.S.R. | 29/610 R |
| 1020869 | 5/1983 | U.S.S.R. | 29/610 R |

*Primary Examiner*—A. D. Pellinen
*Assistant Examiner*—Geoffrey S. Evans
*Attorney, Agent, or Firm*—Wolf, Greenfield & Sacks

[57] ABSTRACT

A method and an apparatus for adjusting the resistance value of a thermal head assembly. One voltage pulse or a set of voltage pulses of a preselected peak value are impressed on the heat generating resistor elements of the thermal head assembly. The resistance values of the resistor elements are then measured and compared with the predetermined target value. If the measured resistance values are above the target value, the resistor elements are subjected to another pulse or set of pulses having a peak value a little higher than the preceding one. Then, the resistance values are again measured and compared with the target value. Thus, the resistance values are decreased by successively impressing voltage pulses with the peak value thereof being increased little by little, until the resistance values become lower than the target value.

13 Claims, 7 Drawing Sheets

METHOD AND APPARATUS FOR RESISTANCE ADJUSTMENT OF THICK FILM THERMAL PRINT HEADS

BACKGROUND OF THE INVENTION

TECHNICAL FIELD

The present invention relates to a method of adjusting the resistance value of a thermal head assembly used mainly in facsimiles and printers, and an apparatus for applying such a method.

PRIOR ART

Thermal head assemblies have been widely used as the quality of thermal recording paper has improved, because such thermal head assemblies are noiseless, maintenance-free and reliable and do not involve any need for development and fixing.

Thermal recording is a sort of technique for making colors come out on thermosensible paper in contact with resistor elements mounted on a substrate or for melting an ink layer on thermal transfer paper to print signal information to be recorded on the thermal transfer paper, by utilizing Joule heat generated by a record current flow applied to and passing through resistor elements mounted on the substrate.

FIG. 1 shows a typical structure of a thermal head assembly which is widely used. The thermal head assembly includes an insulating substrate 1, lead wire portions 2 of electrically conductive material such as Al, Au and Cu formed on substrate 1 by a film-forming technique and filmy resistor elements 3 which are connected at both ends to lead portions 2 and serve as heat generating elements. In many cases, alumina-ceramic substrates with or without a glaze layer are used as the insulating substrate 1. Some examples of suitable materials for the thin-film resistor elements 3 are $Ta_2N$.Ta-$SiO_2$, Ta-Si, Ni-Cu and $Ti_2O_3$. In the case of thickfilm resistor elements, a mixture of rare metal oxide such as $Ru_2O$ or PtO with glass material is applied on substrate 1 and fired. In order to protect the resistor elements 3, a glass film is fired after resistor elements 3 have been formed.

When a constant voltage is applied for a predetermined period between both ends of the lead portions of this thermal head assembly, resistor elements 3 generate heat based on Joule's law. The heat thus generated is transmitted to thermosensible paper 5 (FIG. 2) at portion A of a recording machine constructed as shown in FIG. 2. Colors then come out on thermosensible paper 5 and printing is carried out thereon. In FIG. 2 the same numerals as used in FIG. 1 designate like parts and arrow P indicates the direction of the pressure applied by roll 4.

Generally, thermal head assemblies for facsimiles have about 2,000 resistor elements per head which are provided independently and in parallel. These resistor elements are heated by Joule heat and the surface temperature thereof reaches 250°-600° C. The amount of energy necessary for heating the resistor elements to such a temperature is in the range of from 0.2 mJ to 2 mJ, depending on the resolution of each particular thermal head assembly.

Due to differences in individual producing processes and the constituent material of such resistor elements, the thermal head assemblies are usually classified into three types, that is, a thin film type, a thick-film type and a semiconductor type. In thick-film type thermal head assemblies, heat generating resistor elements are formed by using paste-like resistive material to form a desired pattern on a screen or a photo-resist film, printing or embedding resistive material by a screen printing technique, and firing in a postprocess. In thin-film type thermal head assemblies, heat generating resistor elements are formed by vaporizing or spattering material mainly comprising tantalum to form basic patterns preliminarily and then shaping the respective resistor elements into a desired shape by photoetching. Semiconductor-type thermal head assemblies have resistor elements formed by resistance diffusion to a portion of a silicon substrate, employing almost the same manufacturing process for semiconductor elements, and utilize heat generated from a P-N junction surface.

Among these three types of manufacturing processes, thick-film type and thin-film type thermal head assemblies have been employed in practice. The thin-film type thermal head assemblies have the great advantages of small dispersion in the resistance values of the resistor elements and the capability of forming fine patterns, but the manufacturing process thereof is very complicated. On the other hand, it is possible to manufacture the thick-film type thermal head assemblies cheaply and in a relatively short manufacturing process, but a serious defect of such type of assemblies is that dispersion of the resistance values of the heat generating resistor elements is large. Such dispersion of resistance values will result in non-uniformity in density of the picture quality on the thermosensible paper, because thermal recording utilizes Joule's heat generated from the resistor elements and determined by the resistance values thereof.

FIG. 3 shows an example of the resistance values of the respective resistor elements included in a thermal head assembly.

Normally, dispersion in resistance values of thin-film type thermal head assemblies ranges from $\pm 5\%$ to $\pm 15\%$, whereas that of thick-film type ranges from $\pm 15\%$ to $\pm 30\%$. This indicates that the latter is inferior to the former. Nevertheless, the thick-film type thermal head assemblies are most popular because they have such great advantages as low cost and high reliability including good abrasion-proof characteristics and durability in the face of electric power overloading.

Recently it has become possible to form fine patterns in the thick-type as in the thin-type. For example, when forming conductive patterns, printed layers had to be more than 3 μm thick some time ago, but nowadays it is possible to form fine conductive patterns even when printed layers are less than 3,000 Å thick. This results from the fact that an etching factor of nearly zero can be utilized at the time of photoetching in comparison with the previously applicable etching factor of 20 μm. This means that the etching factor of the thick-film type thermal head assemblies is almost the same as that of the thin-film type. As for improvement of dispersion in the resistance values of the thick-film type, progress has been made in screen printing techniques such as the mesh screen method and the metal mask screen method. Further noticeably improved methods have been proposed in, for example, photoetching on thick-film resistors (cf. Japanese Patent Publication No. 22675/84), embedding thickfilm resistors into photoresist patterns (cf. Japanese Patent Publication No. 18506/82) and polishing surfaces of thick-film resistors (cf. Japanese Patent Public Disclosure No. 99443/79). Japanese Patent Public Disclosure No. 47597/80 discloses thickfilm resistor elements printed on thick-film conductors. All of these methods aim to make uniform the shape of heat generating resistor elements, thereby improving the dispersion in the resistance values.

Improvements have also been made in the materials used for thick-film resistor elements. For example, Japanese Patent Public Disclosures Nos. 9543/78 and 9544/78 disclose ruthenium oxide as being a suitable material for thick-film resistor elements. Other suitable materials include high melting point frit glass and zirconium oxide. These improvements in materials, however, have been with a view to maintaining the reliability of thick-film type thermal head assemblies, and not for the purpose of solving the problem of dispersion of the resistance values of the heat generating resistor elements.

It remains doubtful dispersion of the resistance values of the thick-film type thermal head assemblies will become equal to those of the thin-film type, if the geometrical shape of the thick-film resistor elements is arranged as finely as that of the thick-film resistor elements. Theoretically, the resistance value of a resistor element is shown by the following formula:

$$R=\rho[l/(W\cdot t)](\Omega)$$

$\rho$: the relative resistance of the resistor element ($\Omega$-cm)

l: the length of the resistor element (cm)

W: the width of the resistor element (cm)

t: the thickness of the resistor element (cm).

Normally, heat generating resistor elements formed by screen-printing exhibit small dispersion rates in the length, width and thickness thereof. However, the final problem is the occurrence of dispersion of the relative resistance of the resistor elements due to differences in the bonding degree caused when firing thick film resistor material such as ruthenium oxide, frit glass or zirconium oxide which are basically composed of particles having certain diameters. Such dispersion of the relative resistance results in dispersion of the resistance values.

The above-stated problems cannot be solved by using more precise screen printing in a thick film forming process or by improvements in the conditions for firing or in a preprocess or postprocess for manufacturing heat generating resistor elements. This is because the diameter of a particle of such materials as ruthenium oxide is 5 $\mu$m, which is not negligible, as described in Japanese Patent Public Disclosure No. 9544/79, and because the resistance values of the thick film resistor elements are determined mainly by a non-uniform bonding state at the contact interface, i.e. Me-Is-Me (Metal-Insulator-Metal) between ruthenium oxide and frit glass. It can be supposed because of the change in the bonding state at Me-Is-Me that the resistance values very widely even when thick film resistor elements are made under the same firing temperature, atmosphere and firing speed and by using the same material. Materials for thick film resistor elements having much finer particles of ruthenium oxide or frit glass have become available recently, but the results have proven to be far from what might have been expected.

Accordingly, it will be clear that dispersion of the resistance values of thick film resistor elements cannot be improved until improved dispersion of the thick film resistor elements is obtained despite a non-uniform contact interface. As regards improvement of such dispersion of resistor elements, such methods as laser trimming have been utilized and put into practice for the purpose of adjusting the resistance values of resistor elements formed on thick-film circuit substrates and thin-film circuit substrates. In a liquid-jet recording head assembly as disclosed in Japanese Patent Public Disclosure No. 7360/83, the thin-film resistor elements are laser-trimmed and the resistance values thereof are adjusted so as to match the electrothermal conversion characteristics.

No satisfactory method or process has been proposed for improving the resistance values of the thick film resistor elements. It may be impossible to use a chemical trimming method easily affected by shocks, because mechanical vibrations are generated by the jumping of the rotatable roller which is positioned such as to press thermosensible paper against heat generating resistor elements. Due to the necessity for uniform temperature distribution, the shape of each heat generating resistor element is one of the critical points. It is impossible, therefore, to use mechanical trimming methods such as laser cutting, diamond cutting or sand blast, because these mechanical methods change the shape of the resistor elements and deteriorate the performance of the thermal head assemblies.

SUMMARY OF THE INVENTION

It is a general object of the present invention to solve the above-described problems.

It is another object of the present invention to provide a method and an apparatus for adjusting the resistance values of the heat generating resistor elements of a thick-film type thermal head assembly without changing the shape of the resistor elements. In order to achieve this object, the present invention utilizes the fact that the resistance values of heat generating resistor elements can be decreased by applying voltage pulses to the resistor elements. By this method, dispersion of the resistance values reduces remarkably, making it possible to reduce unevenness in printing depth on thermosensible paper.

According to one aspect of the present invention, a method for adjusting a resistance value of a thermal head assembly is characterized by the step of applying at least one voltage pulse to a plurality of heat generating resistor elements, thereby decreasing the resistance values of said resistor elements. In this method, the resistance values of the heat generating resistor elements are decreased to a value equal to or lower than the predetermined target value. If resistance values measured after applying the voltage pulse are larger than the predetermined value, at least one further voltage pulse is again applied to the resistor elements. If the resistance values measured after applying the voltage pulse are higher than the values obtained before measurement, remeasurement is conducted. Preferably, the peak value of the voltage pulse is increased for each impression in sequence. It is also preferable to limit the number of times of application of the voltage pulse to a number less than a preset limit. An initial preset value for the peak value of a voltage pulse can be set to be above a preselected value or changed according to the resistance values of the heat generating resistor elements. A set of voltage pulses may be applied to the heat generating resistor elements before each measurement.

According to another aspect of the present invention, an apparatus for adjusting the resistance value of a thermal head assembly comprises pulse generating circuit means for generating and applying voltage pulses having predetermined peak values to a group of the heat generating resistor elements selected from the entire number of heat generating resistor elements of the thermal head assembly. The resistance values of the selected group of resistor elements are measured by ohmmeter means after each impression of the voltage pulse. If the measured resistance values are found to be higher than a predetermined value, the pulse generating circuit means generates and applies at least one voltage pulse having a peak value higher than the preceeding one. Preferably the initial value of the peak value of the voltage pulse applied to the heat generating resistor elements is made larger than a preselected value.

According to a further aspect of the present invention, an apparatus for adjusting the resistance value of a thermal head assembly comprises pulse generating circuit means for generating and applying voltage pulses having predetermined peak values to a group of heat generating resistor elements selected from the entire number of heat generating resistor elements of the thermal head assembly. The resistance values of the selected group of resistor elements are measured by ohmmeter means for each impression of the at least one voltage pulse. Switching means is provided for connecting the selected group of resistor elements either to the pulse generating circuit means or to the ohmmeter means. The apparatus may further include a first timer circuit which operates to inhibit the pulse generating circuit means from generating the voltage pulses during a first predetermined period from the time when the pulse generating circuit means has been connected to the heat generating resistor elements through the switching means. A second timer circuit may be provided for inhibiting the switching means from switching to the ohmmeter means during a second predetermined period from the end of impression of a desired number of voltage pulses. Also, a third timer circuit can be provided for inhibiting the pulse generating circuit means from generating the voltage pulses during a third predetermined period from the time when the switching means has been connected to the ohmmeter means.

According to a still further aspect of the present invention, an apparatus for adjusting a resistance value of a thermal head assembly comprises pulses generating circuit means for generating and applying predetermined voltage pulses to a predetermined group of the heat generating resistor elements selected from all the heat generating resistor elements of the thermal head assembly, ohmmeter means for measuring the resistance values of the selected group of resistor elements, and calculating means for carrying out predetermined operations on the basis of measured results supplied from the ohmmeter means and for setting voltage pulse conditions in the pulse generating circuit means. The calculating means compares the measured results from the ohmmeter means with a predetermined value. As a result, the voltage pulse conditions are changed such as to increase the peak value of the voltage pulse if the measured values are higher than the predetermined value, thus resulting in an effective decrease in the resistance values. An initial preset value of the peak value is higher than a preselected value. The calculating means is also operable to compare the resistance values measured before applying a desired number of voltage pulses with those obtained after applying the voltage pulses and to instruct the ohmmeter means to make another measurement if the measured values increase. The calculating means has a function capable of calculating average values and standard deviation values of the resistance values of a plurality of heat generating resistor elements.

DESCRIPTION OF THE PREFERRED EMBODIMENTS

Figure 4:
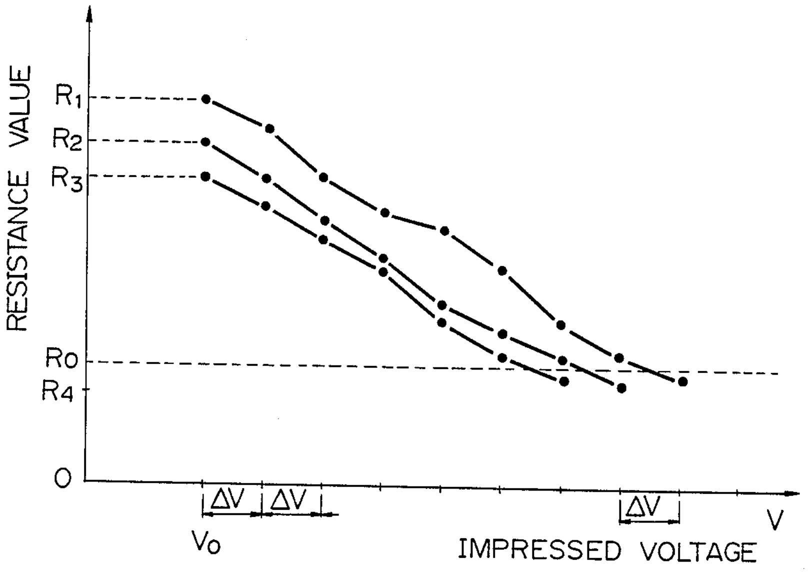
FIG. 4 is a graphic illustration of the principle of the method for adjusting resistance values of the heat generating-resistor elements according to the present invention.

Referring first to FIG. 4, an explanation will be made of the basic principle of the method for adjusting the resistance value of a thermal head assembly according to the present invention. The method is carried out for the purpose of decreasing the resistance values of the heat generating resistor elements after the main processes for manufacturing the thermal head assembly have been completed. More specifically, the processes for decreasing these resistance values are carried out after the heat generating resistor elements, the lead wires and the protective glass film have been formed on the substrate.

The present invention utilizes the phenomenon whereby there is a decrease in the resistance value of a thick-film resistor element when a voltage is applied to the resistor element. It is conjectured that this phenomenon occurs due to the fact that the applied voltage breaks through the insulator of the thick-film resistor element having a MIM (Metal-Insulator-Metal) structure. Anyway, it can be clearly stated that the physical property of the resistor element is changed by the applied voltage.

In FIG. 4 is shown a case where resistance values $R_1$, $R_2$ and $R_3$ of the heat generating resistor elements are adjusted to the reference value $R_0$. First, the resistance value of each resistor element is measured and compared with the target value $R_0$. As a result of this measurement, no voltage pulse is applied to the heat generating resistor elements having a resistance value such as $R_4$ which is below $R_0$. The voltage pulses are applied to the heat generating resistor elements having resistance values $R_1$, $R_2$ and $R_3$ which are above $R_0$.

Hereinafter, a process for adjusting the resistance values of these heat generating resistor elements will be explained in detail. First, a set of voltage pulses having an initial peak value $V_0$ are applied to the resistor elements and the resistance values thereof are thus decreased. Next, each resistance value is measured, and, if the measured values are higher than the reference value $R_0$, another set of voltage pulses having the peak value $(V_0+\Delta V)$ are applied to the resistor elements. After that, measurement of the resistance values is performed, and, if the measured resistance values are still higher than value $R_0$, the other set of voltage pulses having the peak value $(V_0+2\Delta V)$ are impressed on the resistor elements. Thus, each resistance value is decreased gradually to a value equal to or lower than $R_0$ as the peak value of the applied sets of voltage pulses is increased little by little. When the resistance values of the heat generating resistor elements become equal to or lower than $R_0$, the adjusting process is finished, thus enabling the resultant resistance values to reach a value equal to or lower than $R_0$ and within a fixed range. Since it is one object of the present invention to decrease dispersion of the resistance values of the heat generating resistor elements, decrease of the resistance values to a value equal to or lower than $R_0$ alone is unsatisfactory. The resultant resistance values should not only be equal to or lower than $R_0$ but should also be within a fixed range. In order to achieve this purpose, the resistance values need to be decreased gradually and the adjusting process has to be stopped at the moment when the resistance values reach $R_0$ or fall a little below $R_0$.

Figure 5A:
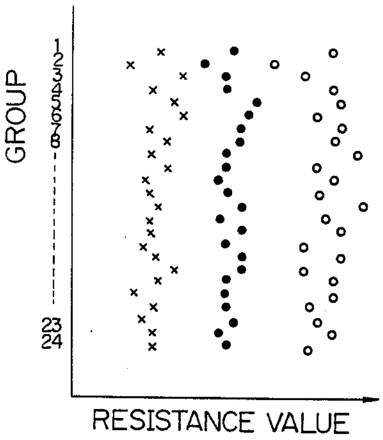
FIG. 5A shows dispersion of the resistance values of the resistor elements of a conventional thermal head assembly.
Figure 5B:
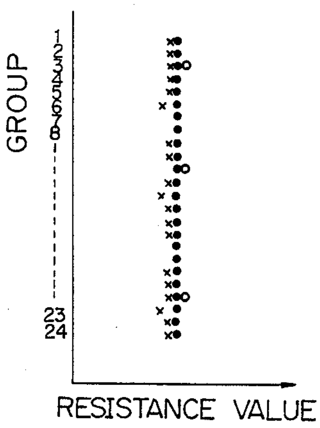
FIG. 5B shows dispersion of the resistance values of the resistor elements of a thermal head assembly manufactured by applying the method of the present invention.

FIG. 5A shows an example of dispersion of the resistance values of the heat generating resistor elements to which the method of the present invention has not been applied, whereas FIG. 5B shows an example of dispersion of the resistance values of the heat generating resistor elements to which the method of the present invention has been applied. In these figures, the heat generating resistor elements are divided into a desired number of groups, each of which includes a plurality of resistor elements. The small circles, the dots and the crosses respectively indicate the maximum value, the average value and the minimum value. As is clearly seen in these figures, dispersion of the resistance values is quite wide in the case of the resistor elements to which the method of the present invention has not been applied, while dispersion has been remarkably reduced in the case of the resistor elements to which the method of the present invention has been applied.

Figure 6:
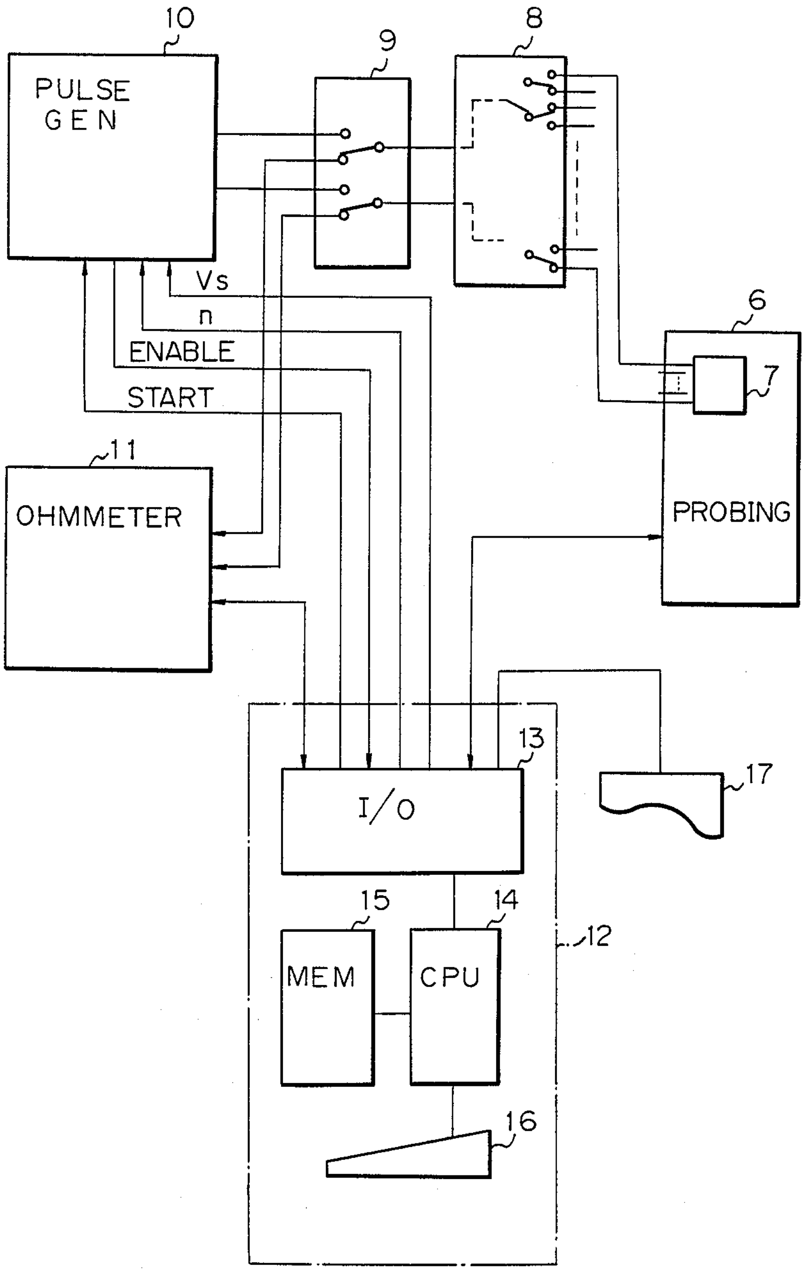
FIG. 6 is a block diagram of an embodiment of an apparatus for carrying out the method of the present invention.

FIG. 6 is a block diagram of an apparatus used for adjusting the resistance values of the heat generating resistor elements according to the present invention. In this figure, probing unit 6 has probes (not shown) which are pressed such as to come into contact with the respective heat generating resistor elements of thermal head assembly 7. A group of the heat generating resistor elements is selected sequentially from all the heat generating resistor elements by relay circuit network 8 which is connected to switching unit 9.

Switching unit 9 is operable to perform switch-over so as to connect the heat generating resistor elements to pulse generating circuit 10 or to ohmmeter 11. Probing unit 6, pulse generating circuit 10 and ohmmeter 11 are controlled by calculating section 12 which includes I/O devices 13, central processing unit (CPU) 14 and memory 15. Keyboard 16 is coupled to CPU 14, and printer 17 is coupled to I/O devices 13.

A method for adjusting the resistance values of the heat generating resistor elements by using the apparatus shown in FIG. 6 will now be described. Calculating section 12 sends to pulse generating circuit 10 preset signal $V_S$ for presetting initial peak value $V_0$ of a set of voltage pulses to be generated (FIG. 7*a*) and the number of voltage pulses n to be impressed on the resistor elements each time a measurement is made.

Figure 7:
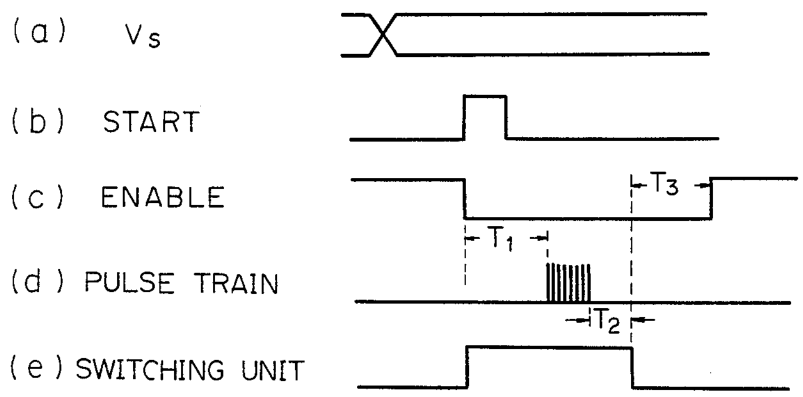
FIG. 7 shows waveforms at the main points of the apparatus shown in FIG. 6.

Upon receiving a voltage-impression-start signal START (FIG. 7*b*) from calculating section 12, pulse generating circuit 10 sends an enable-inhibit signal ENABLE (FIG. 7*c*) back to calculating section 12, and switching unit 9 connects pulse generating circuit 10 and relay circuit network 8 (FIG. 7*e*). During the period in which the enable-inhibit signal is being supplied, the change of peak value $V_0$ and the generation of start signal START are inhibited. This is because the peak value should not be changed during the period in which the voltage pulses are being impressed, and because the next start signal should not be generated until the impression of the current voltage pulses has ended.

After predetermined time $T_1$ (FIG. 7*d*) has passed from the beginning of the impression of signal START, pulse generating circuit 10 generates a set of n voltage pulses (FIG. 7*d*) having peak value $V_0$ and applies this set of pulses through switching unit 9 and relay circuit network 8 to the heat generating resistor elements of thermal head assembly 7. After the lapse of predetermined time $T_2$ from the end of the set of pulses, switching unit 9 is switched to connect relay circuit network 8 to ohmmeter 11. After the further lapse of time $T_3$ from the point of switching, the enable-inhibit signal $\overline{\text{ENABLE}}$ disappears, and the next phase of pulse impression begins. During the period of time $T_3$, each of the resistance values of the heat generating resistor elements are measured and the measured values are sent to calculating section 12. CPU 14 compares these measured values with those obtained from the preceding measurement. If the measured values currently obtained are outside of a predetermined range with respect to the values obtained from the preceding measurement, CPU 14 determines that the electrical contact between the probes and the heat generating resistor elements was bad.

There are various types of methods for setting the above-stated predetermined range, but one of the simplest methods is to compare the currently measured resistance values with those of the preceding measurement and decide whether the former is higher than the latter. Hereafter, one example of this method will be explained.

Figure 1:
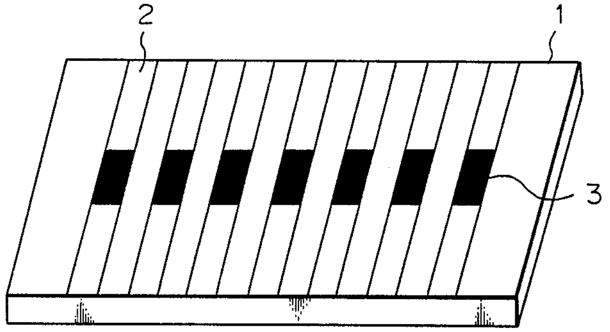
FIG. 1 shows the general structure of a thermal head assembly.
Figure 2:
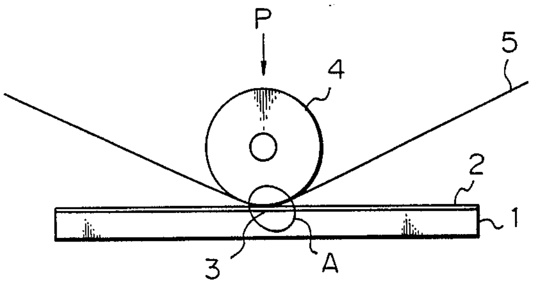
FIG. 2 is used for explaining the state of a thermal head assembly used in a thermal recording apparatus.
Figure 3:
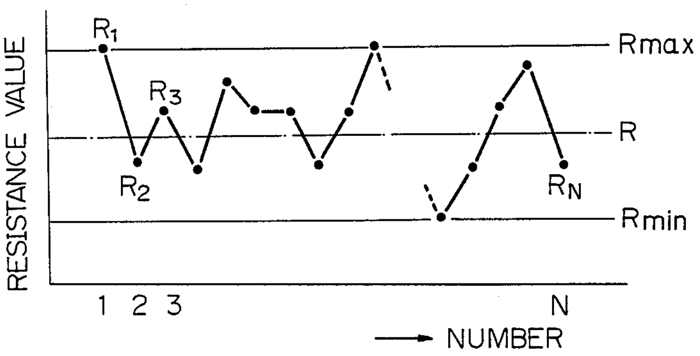
FIG. 3 shows an example of dispersion in resistance values of a typical thermal head assembly.

When the resistance values are found to be higher than those obtained from the preceding measurement, CPU 14 discards the currently obtained values and sends to probing unit 6 signals instructing disconnection of the probes from the heat generating resistor elements to be measured and then bringing them into contact again. At this time, remeasurement of the resistance values is performed. As can be seen from FIG. 1, there is no possible case where the resistance values would be increased, so it may be justifiably concluded that bad electrical contact is the problem when increased resistance values are found. Erroneous measurement of resistance values due to bad electrical contact will make it impossible to range the resistance value in the vicinity of the target value. In the remeasurement which takes place when the probes are again brought into contact with the heat generating resistor elements, the probes should come into contact at a point different from, and a little remote from, the one where the preceding measurement was made. This will avoid the possibility of measurement being made again in the state of bad electrical contact. Specifically, for each measurement the probes make contact at a different point within a so-called pad provided at the end portion of the respective lead wires.

When the currently measured resistance values are lower than the preceding ones, CPU 14 uses the current values and compares them with target value $R_0$. If the measured values are higher than the value aimed for, CPU 14 sends to pulse generating circuit 10 a signal instructing production of another set of n voltage pulses having peak value $(V_0+\Delta V)$ to be applied at the end of the enable-inhibit signal. Then CPU 14 generates start signal START.

In this way, the resistance values of the heat generating resistor elements decrease as the peak value of the applied voltage pulses increases $\Delta V$ by $\Delta V$. When the resistance values reach a value equal to or below target value $R_0$, the adjusting process for the resistance values of the heat generating resistor elements is finished.

Time Limits $T_1$, $T_2$ and $T_3$ are provided in order to avoid the harmful influence of chattering caused by switching unit 9 and relay circuit network 8. It should be noted that even if pulse generating circuit 10 generates a set of voltage pulses before the switching actions in switching unit 9 and relay network 8 is completed, these pulses are not applied to thermal head assembly 7. Also, no precise measurement can be made before the completion of the switching actions of unit 9 and network 8.

A single voltage pulse may possibly be applied to thermal head assembly for each measurement, but a set of voltage pulses would be more easily controllable. The amount of energy of the voltage pulses is defined by the peak value and pulse width $\Delta t$. Voltage pulses having too much energy will break the heat generating resistor elements. Accordingly, the pulse width should be adjusted and decreased in accordance with the peak value of the voltage pulses if the amount of energy thereof is high enough to cause any danger of breaking the resistor elements. In comparison with the adjustment of the pulse width of a single pulse, it is easier to keep pulse width $\Delta t$ of each of the voltage pulses constant and to adjust the ratio of pulse width At to pulse period T, $\Delta t/T$, in accordance with changes in the peak value such that this ratio is set below a value that would involve no danger of breaking the heat generating resistor elements. Alternatively, it is possible to change the number of pulses n in accordance with changes in the peak value, keeping ratio $\Delta t/T$ constant. If the amount of energy of a voltage pulse is sufficiently small, either a single pulse or a set of pulses can be applied to the resistor elements.

In a case where the peak value of the applied voltage pulses is too low, no phenomenon involving decrease in the resistance values can be observed. This means that the single voltage pulse or set of voltage pulses applied for the first measurement should have a peak value of a level that can be expected to bring about the desired decrease in the resistance values, as already described in FIG. 4.

Keyboard 16 is used to change target value $R_0$ and pulse number n. Printer 17 prints out each measured value after applying the voltage pulses and the calculated results received from CPU 14.

Figure 8:
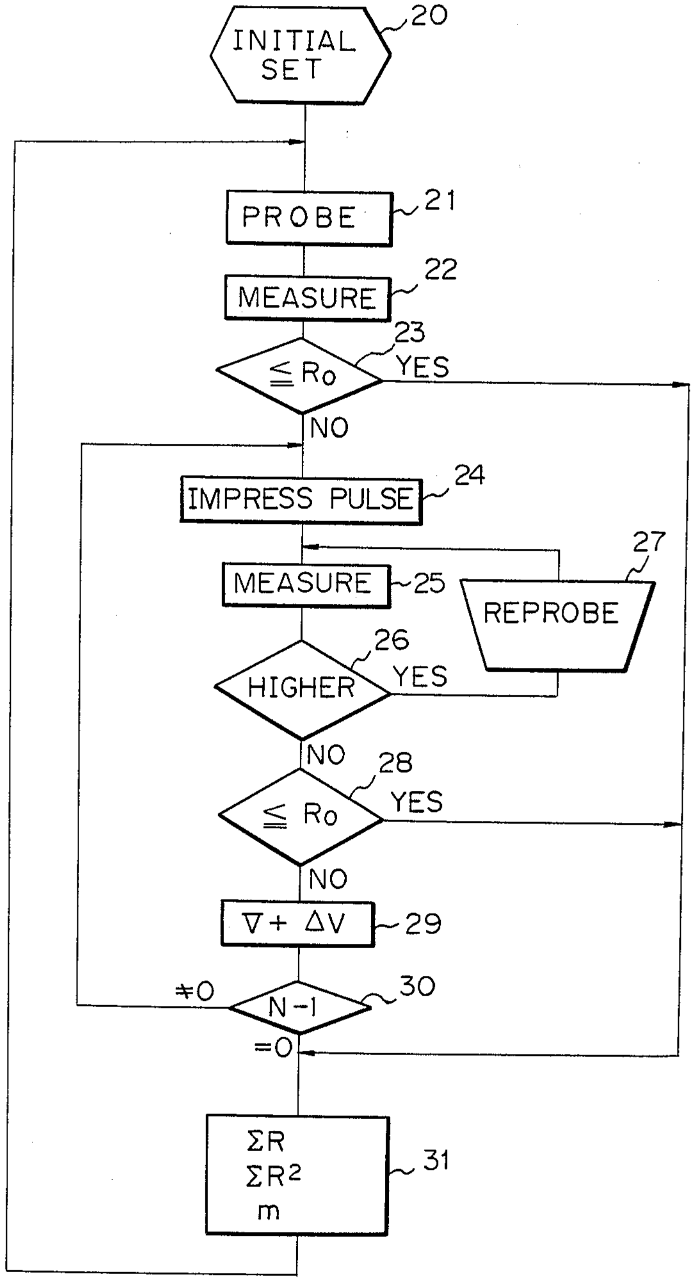
FIG. 8 is a flow chart showing an example of steps for carrying out the method of the present invention.

FIG. 8 shows a flowchart illustrating the method of the present invention for adjusting the resistance value of the heat generating resistor elements. In block 20, the initial values are set in a pulse condition such as peak value $V_0$ and pulse number n. Then, probing unit 6 performs probing of thermal head assembly 7, relay circuit network 8 selects a first group of resistor elements, and switching unit 9 is switched to connect relay circuit network 8 to ohmmeter 11 (block 21). At this time, the resistance values are measured (block 22), and the measured values are compared with target value $R_0$ (block 23). As a result of this comparison, if the measured values are not higher than $R_0$, no voltage pulse is applied to this group of heat generating resistor elements. On the other hand, when the measured resistance values are above target value $R_0$, switching unit 9 is switched to connect pulse generator 10 to relay network 8 and a set of n pulses having initially preset peak value $V_0$ is applied to the resistor elements (block 24) and the resistance values are measured (block 25). After this, the resistance values obtained from the current measurement are compared with those obtained from the preceding measurement (block 26). If the former is above the latter, reprobing is performed (block 27). If the currently measured values are below the last measured values, comparison is made between the currently obtained values and target value $R_0$ (block 28). In a case where the comparison shows that the resistance values have been found to be equal to or below $R_0$, the adjusting process of the heat generating resistor elements is finished. On the other hand, if the currently measured values are still above $R_0$, the peak value of the voltage pulses is incremented by $\Delta V$ and another set of n voltage pulses of the peak value $(V_0+\Delta V)$ is applied to the first group of heat generating resistor elements (block 29).

In this way the adjusting process continues as a rule until all the resistance values have reached a value equal to or below target value $R_0$. Among a number of resistor elements, however, there may be some individual elements whose resistance values do not decrease even if a considerable number of sets of voltage pulses are applied thereto. Also there is an upper limit to the peak value of the voltage pulses generated by pulse generating circuit 10. Accordingly, the number N of sets of voltage pulses is predetermined. When N sets of voltage pulses have been impressed on one group of heat generating resistor elements, the adjusting process is automatically finished (block 30).

When the adjustment of the resistance values of the first group has been completed, CPU 14 performs operations $\Sigma R$ and $\Sigma R^2$ for obtaining the maximum, minimum, average and standard deviation values (block 31). These values are printed out by printer 17 as shown in FIG. 5B.

Then, relay circuit network 8 selects the second group of heat generating resistor elements of thermal head assembly 7, and the same process as described above is applied to the second group. In this way, adjustment of all the groups of resistor elements is made. After that, CPU 14 calculates the average and standard deviation values of the resistance values of all the groups. The calculated results are also printed out by printer 17.

Figure 9:
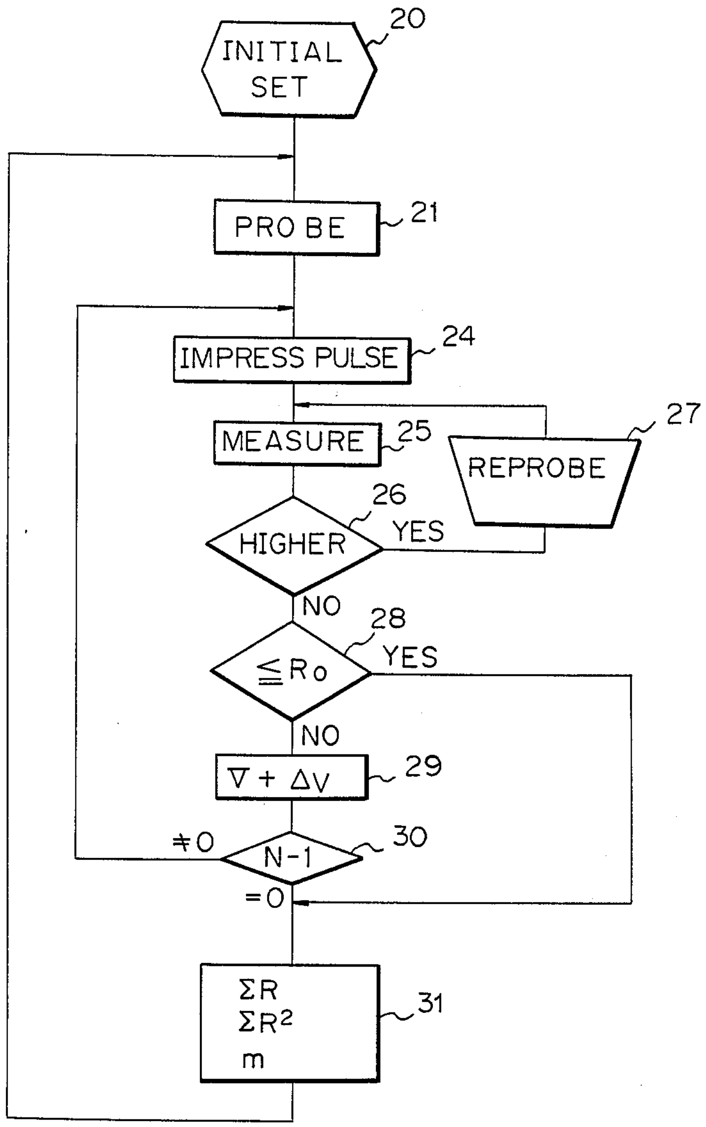
FIG. 9 is a flow chart showing another example of steps for carrying out the method of the present invention.

In the adjusting process described with reference to FIG. 8, the resistance values are measured and compared with the target value (blocks 22 and 23) before the set of voltage pulses is applied to the resistor elements in block 24. If unnecessary, however, these steps of blocks 22 and 23 can be omitted, as shown in FIG. 9, in which the same reference numerals designate blocks which are similar to those in FIG. 8.

Figure 11:
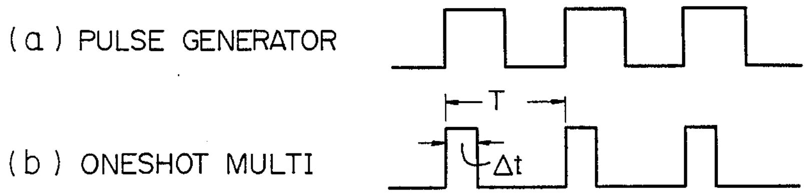
FIG. 11 shows waveforms produced by the pulse generator and the one-shot multivibrator shown in FIG. 10.

Pulse generating circuit 10 will now be described in detail with reference to FIGS. 10 and 11. Pulse generating circuit 10 includes three flipflops 40, 42 and 52. Flipflop 40 receives start signal START from calculating section 12 and sends one output signal to timer circuit 41 which sets predetermined period $T_1$. The other output of flipflop 40 is connected to port ENABLE of calculating section 12. Signal START is also applied to flipflop 52 whose output is connected to coil 91 of switching unit 9. Flipflop 42 receives the output from timer circuit 41 and controls AND gate 44 which, when enabled, passes voltage pulses from pulse generator 43 to one-short multivibrator 45 and counter 48. The output from one-shot multivibrator 45 is connected to the base of transistor 46. The emitter of transistor 46 is connected to switching unit 9, and the collector of transistor 46 is connected to voltage regulator 47 which receives peak value presetting signal $V_S$ from section 12. Comparator 49 receives the output from counter 48 and pulse number presetting signals from calculating section 12, and sends an output signal to flipflop 42, counter 48 and timer circuit 50 which sets predetermined period $T_2$. One of the outputs of timer circuit 50 is connected to flipflop 52 and the other output is connected to timer circuit 51 which sets predetermined period $T_3$ and controls flipflop 40.

In operation, upon receiving start signal START from calculating section 12, flipflops 40 and 52 are set. Flipflop 40 then sends enable-inhibit signal $\overline{\text{ENABLE}}$ to calculating section 12 to inhibit section 12 from changing peak value $V_0$ and generating another start signal within the period of the enable-inhibit signal. The output signal from flipflop 52 actuates switching unit 9, and coil 91 makes contacts 92 and 93 move from one position shown in the figure to the other position. When time period $T_1$ has passed since flipflop 40 was set, timer circuit 41 provides an output signal by which flipflop 42 makes a transition to the set state. This enables AND gate 44 to pass voltage pulses generated by pulse generator 43 to one-shot multivibrator 45.

One-shot multivibrator 45 operates to shape the pulses from pulse generator 43 to form pulses having a desired pulse width $\Delta t$ which is determined by resistors and capacitances contained in one-shot multivibrator 45. FIGS. 11(*a*) and (*b*) shows waveforms of the output pulses output from generator 43 and one-shot multivibrator 45, respectively.

Pulses output from one-shot multivibrator 45 drive the base electrode of transistor 46. That is, transistor 46 remains in the conductive state during period At each time one pulse is applied to the base electrode. During the period of the conductive state of transistor 46, the output voltage from voltage regulator 47 is applied through contacts 92 and 93 of switching unit 9 and relay circuit network 8 to a group of heat generating resistor elements. The peak value of the output voltage signals from regulator 47 is determined by peak value presetting signal $V_S$ from calculating section 12.

Counter 48 receives the pulses passing through AND gate 44 and counts the number thereof. The count value of counter 48 is compared by comparator 49 with predetermined pulse number n supplied from calculating section 12. When the count value becomes equal to n, comparator 49 sends an output signal to flipflop 42 and timer circuit 50. Accordingly, flipflop 42 is reset and AND gate 44 is closed. Thus, one cycle for applying a set of n voltage pulses to the group of resistor elements is completed.

Timer circuit 50 provides an output signal after period $T_2$ from receipt of the output signal from comparator 49. Flipflop 52 is then reset by the output signal from timer circuit 50 and turns off coil 91, by which the position of contacts 92 and 93 is changed to connect the group of heat generating resistor elements with ohmmeter 11. Then, the resistance values of the group of resistor elements are measured by ohmmeter 11.

When the period $T_3$ has passed since timer circuit 50 provided the output signal, timer circuit 51 sends an output signal to flipflop 40. Then flipflop 40 is reset and its output $\overline{Q}$ goes to a high level, whereupon enable-inhibit signal $\overline{\text{ENABLE}}$ disappears. At this point, pulse generating circuit 10 completes one full cycle during which a set of n voltage pulses of peak value $V_0$ are generated, and waits for the next start signal from calculation section 12.

One example of the results of experiments conducted on the change in resistance values is now given. Without applying the method of the present invention, the absolute value of dispersion in the resistance values is ±20%, and the standard deviation thereof is 5.6%. In contrast, when applying the method of the present invention, the absolute value of dispersion in the resistance values is ±3%, and the standard deviation is 0.4%. This clearly indicates that dispersion in the resistance values is remarkably reduced by the method of the present invention. The reduction of dispersion in the resistance values results in nearly complete removal of unevenness in printing by the thermal head assembly. In this experiment, the inventors used the following amounts for adjusting the resistance values of the heat generating resistor elements:

- the initial preset peak value of the voltage pulses ($V_0$ in FIG. 4)—several tens of volts;
- the increment in voltage of each set of voltage pulses ($\Delta V$)—from one to several volts;
- the pulse number contained in a set of voltage pulses (n)—between ten and twenty;
- the pulse width of one pulse ($\Delta t$)—from one to several microseconds;
- the pulse spacing—several tens of microseconds;
- the first and second time limits ($T_1$ and $T_2$)—about ten milliseconds;
- the third time limit ($T_3$)—several millisecond.

It should be noted that the above-mentioned amounts of the parameters used for adjustment merely represent an example, and that such parameters are to be selected within the spirit and scope of the present invention.

In block 24 shown in FIGS. 8 and 9, comparison is made as to whether the currently measured values are higher than the values obtained in the preceding measurement. Instead, it is possible to decide if the ratio of the current values to the preceding values are within a fixed range, for example, 0.9–1.0, and to instruct another measurement if the ratio is outside of the fixed range.

Figure 10:
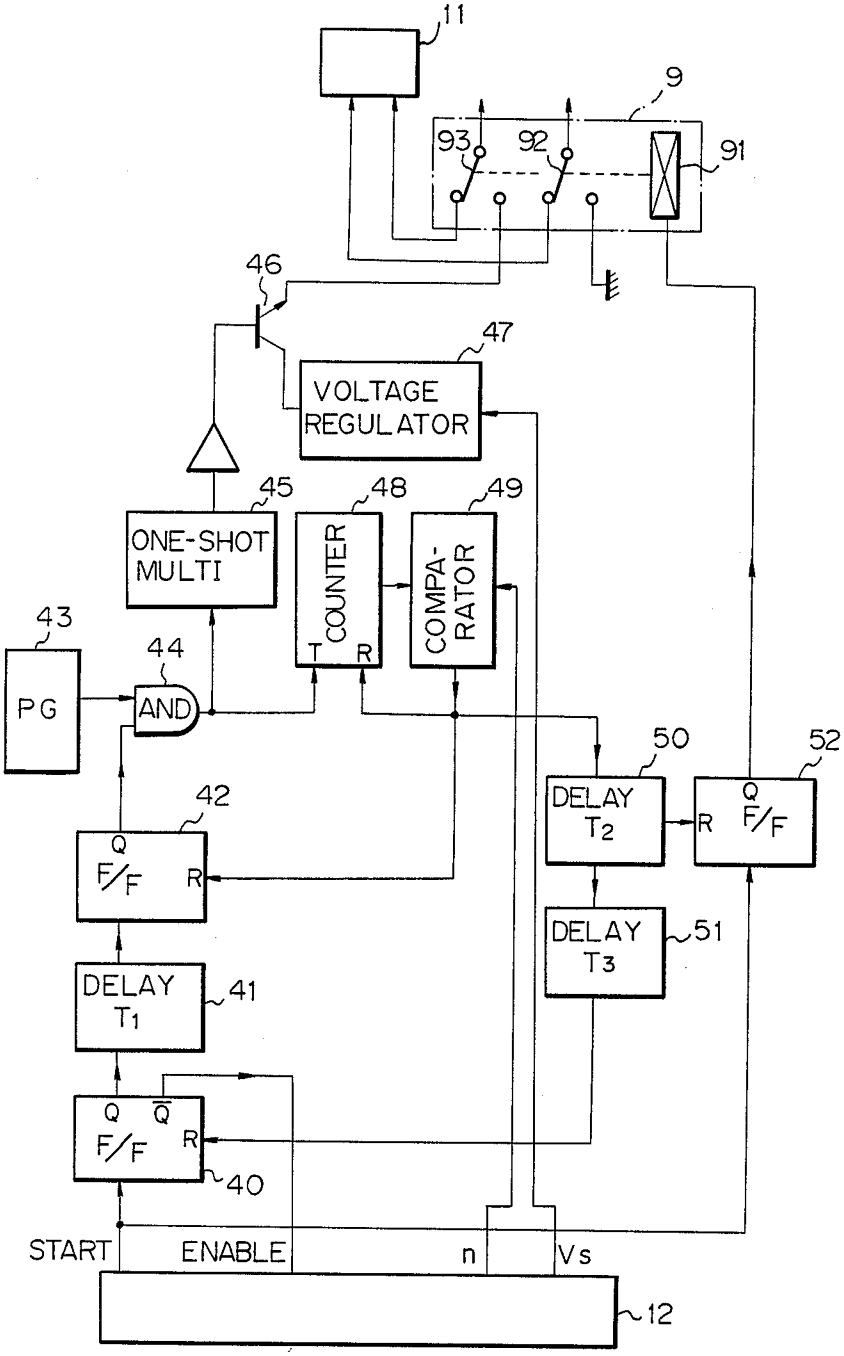
FIG. 10 shows a detailed view of the pulse generating circuit shown in FIG. 6.

Apparatuses for putting into practice the method of the present invention are not limited to the embodiments shown in FIGS. 6 and 10 alone. Peak value setting signal $V_S$ and pulse number presetting signal n may be manually supplied to pulse generating circuit 10 instead of automatic supply from calculating section 12. In this modified case, pulse generating circuit 10 is provided with manually operable switches for setting peak value $V_0$ and pulse number n. Of course it is possible to use a manual setting in combination with an automatic setting. In FIG. 10, switching unit 9 comprises a relay whose contacts 91 and 92 are driven by coil 91. Instead of the relay, semiconductor switching devices can alternatively be used.

While the invention has been shown and described particularly with reference to preferred embodiments thereof, it will be understood by those skilled in the art that the foregoing and other changes can be made therein without departing from the spirit and scope of the invention.

The scope of the invention, therefore, is to be determined solely by the following claims.

What is claimed is:

1. An apparatus for adjusting the resistance values of heat generating elements in a a thermal head assembly, said apparatus comprising:

ohmmeter means for measuring the resistance value of each heat generating resistor element in a group selected from all of said heat generating resistor elements;

voltage pulse generating circuit means controllable to generate and apply voltage pulses to each heat generating resistor element in said group;

means responsive to a measured resistance value of each heat generating resistor element in said group for controlling said voltage pulse generating circuit means to generate and apply at least one voltage pulse having a predetermined peak voltage value to each heat generating resistor element in said group;

switching means for selectively connecting each heat generating resistor element in said group to said voltage pulse generating circuit means and to said ohmmeter means; and a first timer circuit for inhibiting said voltage pulse generating circuit means from generating voltage pulses during a first predetermined time period commencing when said voltage pulse generating circuit means is connected to each heat generating resistor element in said group through said switching means.

2. An apparatus according to claim 1 further comprising a second timer circuit for inhibiting said switching means from switching to said ohmmeter means during a predetermined second time period commencing after a predetermined number of voltage pulses have been applied to each heat generating element in said group.

3. An apparatus according to claim 2 further comprising a third timer circuit for inhibiting said voltage pulse generating circuit means from generating voltage pulses during a predetermined third time period commencing when each heat generating resistor element in said group is connected to said ohmmeter means by said switching means.

4. A method of adjusting the resistance values of heat generating resistor elements of a thermal head assembly, characterized by the steps of:

A. measuring the initial resistance values of said heat generating elements,

B. applying a first voltage pulse having a first peak voltage value to said heat generating resistor elements to decrease the initial resistance values of said heat generating resistor elements if the measured resistance values of said heat generating resistor elements are higher than a predetermined value, C. measuring the resistance values of said heat generating elements, D. applying a further voltage pulse having a further peak voltage value if the measured resistance values of said heat generating resistor elements are higher than said predetermined value, and E. repeating Steps C and D with a sequence of voltage pulses wherein the peak voltage value of the voltage pulses in said sequence is increased in sequence.

5. A method according to claim 4 wherein the number of times the voltage pulses are applied is limited to a number less than a preset number.

6. A method according to claim 4 wherein said first peak voltage value is higher than a preselected value.

7. A method according to claim 6 wherein said preselected value is calculated based on the initial resistance values of said heat generating resistor elements.

8. An apparatus for adjusting the resistance values of heat generating resistor elements in a thermal head assembly, said apparatus comprising:

ohmmeter means for measuring the resistance value of each heat generating resistor element in a group selected from all of said heat generating resistor elements;

voltage pulse generating circuit means controllable to generate and apply voltage pulses to each heat generating resistor element in said group;

means responsive to a measured resistance value of each heat generating resistor element in said group for controlling said voltage pulse generating circuit means to generate and apply at least one voltage pulse having a predetermined peak voltage value to each heat generating resistor element in said group, said controlling means controlling said voltage pulse generating circuit means to generate and apply to each heat generating resistor element in said group at least one further voltage pulse having a peak voltage value higher than said predetermined peak voltage value if a resistance value of any heat generating resistor element in said group measured after the impression of said at least one voltage pulse is higher than a predetermined resistance value.

9. An apparatus according to claim 8 wherein said predetermined peak voltage value is higher than a preselected value.

10. An apparatus for adjusting the resistance values of heat generating elements in a a thermal head assembly, said apparatus comprising:

ohmmeter means for measuring the resistance value of each heat generating resistor element in a group selected from all of said heat generating resistor elements;

voltage pulse generating circuit means controllable to generate and apply voltage pulses to each heat generating resistor element in said group;

means responsive to a measured resistance value of each heat generating resistor element in said group for controlling said voltage pulse generating circuit means to generate and apply at least one voltage pulse having a predetermined peak voltage value to each heat generating resistor element in said group;

calculating means responsive to first measured resistance values generated by said ohmmeter means for comparing said first measured resistance values with a predetermined resistance value and for increasing said predetermined peak voltage value if said first measured resistance values are greater than said predetermined resistance value.

11. An apparatus according to claim 10 wherein said predetermined voltage value is higher than a preselected voltage value.

12. An apparatus according to claim 10 wherein said calculating means compares second measured resistance values measured before applying a plurality of voltage pulses with third measured resistance values measured after applying said plurality of voltage pulses and controls said ohmmeter means to remeasure the resistance value of each heat generating resistor element in said group if said third measured resistance values are greater than said second measured resistance values.

13. An apparatus according to claim 10 wherein said calculating means calculates average values and standard deviation values of measured resistance values of heat generating resistor elements in said group.

* * * * *

UNITED STATES PATENT AND TRADEMARK OFFICE
CERTIFICATE OF CORRECTION

PATENT NO. : B1 4,782,202

DATED : March 8, 1994

INVENTOR(S) : Tetsunori Sawae, Hiromi Yamashita, Takafumi Endo; Kohei Katayama and Yukio Murata

It is certified that error appears in the above-identified patent and that said Letters Patent is hereby corrected as shown below:

On the title page at "Reexamination Certificate for:", please change as follows:

| | |
|---|---|
| Patent No.: | 4,782,202 |
| Issued: | November 1, 1988 |
| Appln. No.: | 946,968 |
| Filed | December 29, 1986 |

Signed and Sealed this

Nineteenth Day of March, 1996

*Attest:*

BRUCE LEHMAN

*Attesting Officer* — *Commissioner of Patents and Trademarks*

US004782202B1

REEXAMINATION CERTIFICATE (2239th)

United States Patent [19]

Sawae et al.

[11] B1 4,782,202

[45] Certificate Issued Mar. 8, 1994

[54] METHOD AND APPARATUS FOR RESISTANCE ADJUSTMENT OF THICK FILM THERMAL PRINT HEADS

[75] Inventors: Tetsunori Sawae; Hiromi Yamashita; Takafumi Endo; Kohei Katayama; Yukio Murata, all of Hyogo, Japan

[73] Assignee: Mitsubishi Denki Kabushiki Kaisha, Japan

Reexamination Request:
No. 90/002,862, Oct. 9, 1992

Reexamination Certificate for:
Patent No.: 4,782,202
Issued: Dec. 29, 1986
Appl. No.: 946,968
Filed: Nov. 1, 1988

[51] Int. Cl.$^5$ .......... H01L 49/00; B41J 3/20

[52] U.S. Cl. .......... 219/68; 29/610.1; 346/76 PH; 437/172

[58] Field of Search .......... 219/68, 69.1; 338/195; 346/76 PH; 324/691, 702, 703, 705, 706, 719; 29/593, 610.1, 611, 620; 437/70, 172, 918; 364/482, 468, 552, 811, 812; 400/120

[56] References Cited

U.S. PATENT DOCUMENTS

| | | | |
|---|---|---|---|
| 881,010 | 3/1908 | Krannichfeldt | 29/610.1 |
| 3,261,082 | 7/1966 | Maissel et al. | 29/610.1 |
| 3,308,528 | 3/1967 | Bullard et al. | 29/610.1 |
| 3,333,326 | 8/1967 | Thomas, Jr. et al. | 437/918 |
| 3,339,063 | 8/1967 | Norsworthy | 364/812 |
| 3,388,461 | 6/1968 | Lins | 29/610.1 |
| 3,548,303 | 12/1970 | Helgeland | 29/610.1 |
| 3,952,185 | 4/1976 | Stultz et al. | 364/812 |
| 4,210,996 | 7/1980 | Amemiya et al. | 29/610.1 |
| 4,570,332 | 2/1986 | Yamauchi | 437/170 |
| 4,606,781 | 8/1986 | Vyne | 437/170 |
| 4,705,931 | 11/1987 | Di Mino | 219/68 |

FOREIGN PATENT DOCUMENTS

| | | | |
|---|---|---|---|
| 845892 | 6/1970 | Canada . | |
| 149829 | 7/1981 | Fed. Rep. of Germany | 29/610.1 |
| 48-18753 | 3/1973 | Japan . | |
| 52-8500 | 3/1977 | Japan . | |
| 53-9543 | 1/1978 | Japan . | |
| 53-9544 | 1/1978 | Japan . | |
| 54-3406 | 3/1979 | Japan . | |
| 55-38812 | 10/1980 | Japan . | |
| 59-162064 | 9/1984 | Japan | 219/216 |
| 59-203965 | 11/1984 | Japan | 324/705 |
| 60-87071 | 5/1985 | Japan | 346/76 PH |
| 60-192662 | 10/1985 | Japan | 346/76 PH |
| 60-192666 | 10/1985 | Japan | 346/76 PH |
| 61-83054 | 4/1986 | Japan | 346/76 PH |
| 61-83062 | 4/1986 | Japan | 346/76 PH |
| 902084 | 1/1982 | U.S.S.R. | 29/610.1 |
| 1020869 | 5/1983 | U.S.S.R. | 29/610.1 |

OTHER PUBLICATIONS

"Measuring Techniques for Trimming Thick Film Resistors", by Ironside et al., pp. 536-546 of Conference Proceedings of the 1970 Electronic Components Conference Washington, D.C. USA (13-15 May 1970).

Translation of Japan Patent Document 60-192,622 PTO-93-2886, Jun./1993.

"Pulsed High-Voltage Resistor Trimmer", by Greenman et al., IBM Technical Disclosure Bulletin, vol. 10, No. 4, Sep. 1967.

Constantin et al, "Effect of Surge Voltage on Thin and Thick Film Resistors", Proc. of 1982 Microelectronic Conf., May 1982, pp. 51-55.

Glang et al, "Pulse Trimming of Thin Film Resistors", IEEE Spectrum, Aug. 1969, pp. 72-81.

Himmel et al, "Thick Film Resistor Adjustment by High Voltage Discharge", Proc. of 21st Electronics Components Conference, May 1971, pp. 504-512.

Pakulski et al, "Electric Discharge Trimming of Glaze Resistors", Proc. of Hybrid Microelectronics Symposium, Oct. 1968, pp. 145-152.

Seager et al, "Electric Field Induced Changes in Thick Film Resistors", Proc. of the International Microelectronics Symposium Oct. 1976, pp. 115-122.

S. Honda, "Trimming Method of Resistor Elements", Electronic Review, Dec./1969, p. 103.

*Primary Examiner*—Geoffrey S. Evans

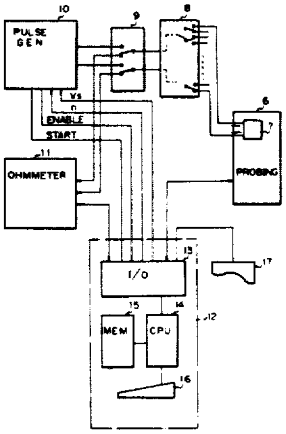

[57] ABSTRACT

A method and an apparatus for adjusting the resistance value of a thermal head assembly. One voltage pulse or a set of voltage pulses of a preselected peak value are impressed on the heat generating resistor elements of the thermal head assembly. The resistance values of the resistor elements are then measured and compared with the predetermined target value. If the measured resistance values are above the target value, the resistor elements are subjected to another pulse or set of pulses having a peak value a little higher than the preceding one. Then, the resistance values are again measured and compared with the target value. Thus, the resistance values are decreased by successively impressing voltage pulses with the peak value thereof being increased little by little, until the resistance values become lower than the target value.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–3 is confirmed.

Claims 4, 6, 8–11 are cancelled.

Claims 5, 7, 12 and 13 are determined to be patentable as amended.

New claims 14–29 are added and determined to be patentable.

5. A method [according to claim 4] *of adjusting the resistance values of heat generating thick film resistor elements of a thermal head assembly, said method characterized by the steps of:*

*A. measuring the initial resistance values of said heat generating resistor elements,*

*B. selecting a first peak value for a first voltage pulse to be applied to each of said heat generating elements that exceeds a predetermined target value to decrease the initial resistances of said heat generating elements by a desired amount,*

*C. applying the first voltage pulse having the first peak voltage value to said heating generating resistor elements to decrease the initial resistance values of said heat generating resistor elements if the measured resistance values of said heating generating resistor elements are higher than the target value,*

*D. measuring the resistance values of said heating generating elements,*

*E. selecting a further peak value for a further voltage pulse to decrease measured resistance values,*

*F. applying the further voltage pulse having the further peak voltage value if the measured resistance values of said heating generating resistor elements are higher than said target value, and*

*G. repeating Steps D, E, and F with a sequence of voltage pulses wherein the peak voltage value of the voltage pulses in said sequence is increased in sequence, until a desired resistance value is obtained,* wherein the number of times the voltage pulses are applied is limited to a number less than a preset number.

7. A method [according to claim 6] *of adjusting the resistance values of heat generating thick film resistor elements of a thermal head assembly, said method characterized by the steps of:*

*A. measuring the initial resistance values of said heat generating resistor elements,*

*B. selecting a first peak value for a first voltage pulse to be applied to each of said heat generating elements that exceeds a predetermined target value to decrease the initial resistances of said heat generating elements by a desired amount, wherein said first peak voltage value is higher than a preselected value, and* wherein said preselected value is calculated based on the initial resistance values of said heat generating resistor elements[.] *,*

*C. applying the first voltage pulse having the first peak voltage value to said heating generating resistor elements to decrease the initial resistance values of said heat generating resistor elements if the measured resistance values of said heating generating resistor elements are higher than the target value,*

*D. measuring the resistance values of said heating generating elements,*

*E. selecting a further peak value for a further voltage pulse to decrease measured resistance values,*

*F. applying the further voltage pulse having the further peak voltage value if the measured resistance values of said heating generating resistor elements are higher than said target value, and*

*G. repeating Steps D, E, and F with a sequence of voltage pulses wherein the peak voltage value of the voltage pulses in said sequence is increased in sequence, until a desired resistance value is obtained.*

12. An apparatus [according to claim 10] *for adjusting the resistance values of heat generating elements in a thermal head assembly, said apparatus comprising:*

*ohmmeter means for measuring the resistance values of each heat generating resistor element in a group selected from all of said heat generating resistor elements;*

*voltage pulse generating circuit means controllable to generate and apply voltage pulses to each heat generating resistor element in said group;*

*means responsive to a measured resistance value of each heat generating resistor element in said group for controlling said voltage pulse generating circuit means to generate and apply at least one voltage pulse having a predetermined peak voltage value to each heat generating resistor element in said group;*

*calculating means responsive to first measured resistance values generated by said ohmmeter means for comparing said first measured resistance values with a predetermined resistance value and for increasing said predetermined peak voltage value if said first measured resistance values are greater than said predetermined resistance value,* wherein said calculating means compares second measured resistance values measured before applying a plurality of voltage pulses with third measured resistance values measured after applying said plurality of voltage pulses and controls said ohmmeter means to remeasure the resistance value of each heat generating resistor element in said group if said third measured resistance values are greater than said second measured resistance values.

13. An apparatus [according to claim 10] *for adjusting the resistance values of heat generating elements in a thermal head assembly, said apparatus comprising:*

*ohmmeter means for measuring the resistance values of each heat generating resistor element in a group selected from all of said heat generating resistor elements;*

*voltage pulse generating circuit means controllable to generate and apply voltage pulses to each heat generating resistor element in said group;*

*means responsive to a measured resistance value of each heat generating resistor element in said group for controlling said voltage pulse generating circuit means to generate and apply at least one voltage pulse having*

*a predetermined peak voltage value to each heat generating resistor element in said group;*

*calculating means responsive to first measured resistance values generated by said ohmmeter means for comparing said first measured resistance values with a predetermined resistance value and for increasing said predetermined peak voltage value if said first measured resistance values are greater than said predetermined resistance value,* wherein said calculating means calculates average values and standard deviation values of measured resistance values of heat generating resistor elements in said group.

*14. A method of adjusting the resistance values of heat generating thick film resistor elements of a thermal head assembly, said method characterized by the steps of:*

*A. measuring the initial resistance values of said heat generating resistor elements,*

*B. selecting a first peak value for a first voltage pulse to be applied to each of said heat generating elements that exceeds a predetermined target value to decrease the initial resistances of said heat generating elements by a desired amount,*

*C. applying the first voltage pulse having the first peak voltage value to said heating generating resistor elements to decrease the initial resistance values of said heat generating resistor elements if the measured resistance values of said heating generating resistor elements are higher than the target value,*

*D. measuring the resistance values of said heating generating elements,*

*E. selecting a further peak value for a further voltage pulse to decrease measured resistance values,*

*F. applying the further voltage pulse having the further peak voltage value if the measured resistance values of said heating generating resistor elements are higher than said target value, and*

*G. repeating Steps D, E, and F with a sequence of voltage pulses wherein the peak voltage value of the voltage pulses in said sequence is increased in sequence, until a desired resistance value is obtained,*

*wherein the pulses are applied with a pulse generating circuit and the resistance is measured by an ohmmeter means for heat generating resistor elements in a group, and wherein the step of measuring the resistance values comprises:*

*selectively connecting each heat generating resistor element in the group to the pulse generating circuit and to the ohmmeter, and*

*inhibiting the pulse generating circuit from generating voltage pulses for a first predetermined time period commencing when the pulse generating circuit is connected to each heat generating resistor element in the group.*

*15. The method of claim 14 further comprising the step of inhibiting said switching means from switching to said ohmmeter means during a second predetermined time period commencing after a predetermined number of voltage pulses have been applied to each heat generating element in the group.*

*16. The method of claim 15 further comprising the step of inhibiting said voltage pulses during a third predetermined time period commencing when each heat generating resistor element in said group is connected to said ohmmeter means by said switching means.*

*17. A method of adjusting the resistance values of heat generating thick film resistor elements of a thermal head assembly, said method characterized by the steps of:*

*A. measuring the initial resistance values of said heat generating resistor elements,*

*B. selecting a first peak value for a first voltage pulse to be applied to each of said heat generating elements that exceeds a predetermined target value to decrease the initial resistances of said heat generating elements by a desired amount,*

*C. applying the first voltage pulse having the first peak voltage value to said heating generating resistor elements to decrease the initial resistance values of said heat generating resistor elements if the measured resistance values of said heating generating resistor elements are higher than the target value,*

*D. measuring the resistance values of said heating generating elements,*

*E. selecting a further peak value for a further voltage pulse to decrease measured resistance values,*

*F. applying the further voltage pulse having the further peak voltage value if the measured resistance values of said heating generating resistor elements are higher than said target value, and*

*G. repeating Steps D, E, and F with a sequence of voltage pulses wherein the peak voltage value of the voltage pulses in said sequence is increased in sequence, until a desired resistance value is obtained,*

*wherein the step of applying the first voltage pulse and the step of applying the further voltage pulse each comprise applying a predetermined number of pulses having the same voltage, the predetermined number being a number greater than 1.*

*18. The method of claim 17 further comprising the step, prior to the step of applying a further voltage pulse, of changing the predetermined number of pulses having the same voltage.*

*19. A method of adjusting the resistance values of heat generating thick film resistor elements of a thermal head assembly, said method characterized by the steps of:*

*A. measuring the initial resistance values of said heat generating resistor elements,*

*B. selecting a first peak value for a first voltage pulse to be applied to each of said heat generating elements that exceeds a predetermined target value to decrease the initial resistances of said heat generating elements by a desired amount,*

*C. applying the first voltage pulse having the first peak voltage value to said heating generating resistor elements to decrease the initial resistance values of said heat generating resistor elements if the measured resistance values of said heating generating resistor elements are higher than the target value,*

*D. measuring the resistance values of said heating generating elements,*

*E. selecting a further peak value for a further voltage pulse to decrease measured resistance values,*

*F. applying the further voltage pulse having the further peak voltage value if the measured resistance values of said heating generating resistor elements are higher than said target value,*

*G. repeating Steps D, E, and F with a sequence of voltage pulses wherein the peak voltage value of the voltage pulses in said sequence is increased in sequence, until a desired resistance value is obtained,*

*H. determining how many times step G has been performed,*

*I. comparing the number of times step G has been performed with a predetermined limit, and*

*J. terminating the application of pulses when the limit is reached.*

*20. A method of adjusting the resistance values of heat generating thick film resistor elements of a thermal head assembly, said method characterized by the steps of:*

*A. measuring the initial resistance values of said heat generating resistor elements,*

*B. selecting a first peak value for a first voltage pulse to be applied to each of said heat generating elements that exceeds a predetermined target value to decrease the initial resistances of said heat generating elements by a desired amount,*

*C. applying the first voltage pulse having the first peak voltage value to said heating generating resistor elements to decrease the initial resistance values of said heat generating resistor elements if the measured resistance values of said heating generating resistor elements are higher than the target value,*

*D. measuring the resistance values of said heating generating elements,*

*E. selecting a further peak value for a further voltage pulse to decrease measured resistance values,*

*F. adjusting the width of the pulse,*

*G. applying the further voltage pulse having the further peak voltage value if the measured resistance values of said heating generating resistor elements are higher than said target value, and*

*H. repeating Steps, D, E, F, and G with a sequence of voltage pulses wherein the peak voltage value of the voltage pulses in said sequence is increased in sequence, until a desired resistance value is obtained.*

*21. A method of adjusting the resistance values of heat generating thick film resistor elements of a thermal head assembly, said method characterized by the steps of:*

*A. measuring the initial resistance values of said heat generating resistor elements,*

*B. selecting a first peak value for a first voltage pulse to be applied to each of said heat generating elements that exceeds a predetermined target value to decrease the initial resistances of said heat generating elements by a desired amount,*

*C. applying the first voltage pulse having the first peak voltage value to said heating generating resistor elements to decrease the initial resistance values of said heat generating resistor elements if the measured resistance values of said heating generating resistor elements are higher than the target value,*

*D. measuring the resistance values of said heating generating elements,*

*E. selecting a further peak value for a further voltage pulse to decrease measured resistance values,*

*F. applying the further voltage pulse having the further peak voltage value if the measured resistance values of said heating generating resistor elements are higher than said target value, and*

*G. repeating Steps D, E, and F with a sequence of voltage pulses wherein the peak voltage value of the voltage pulses in said sequence is increased in sequence, until a desired resistance value is obtained, the method further comprising the steps of:*

*comparing resistance values of heat generating resistor elements before and after a voltage pulse is applying to a heat generating resistor element,*

*disengaging the ohmmeter means from the heat generating resistor elements in the group in response to a determination that the resistance values are higher after application of a pulse, and*

*reengaging the ohmmeter means after a selected period of time.*

*22. An apparatus for adjusting the resistance values of heat generating elements in a thermal head assembly, said apparatus comprising:*

*ohmmeter means for measuring the resistance value of each heat generating resistor element in a group selected from all of said heat generating resistor elements;*

*voltage pulse generating circuit means controllable to generate and apply voltage pulses to each heat generating resistor element in said group;*

*means responsive to a measured resistance value of each heat generating resistor element in said group for controlling said voltage pulse generating circuit means to generate and apply at least one voltage pulse having a predetermined peak voltage value to each heat generating resistor element in said group, said controlling means controlling said voltage pulse generating circuit means to generate and apply to each heat generating resistor element in said group at least one further voltage pulse having a peak voltage value if a resistance value of any heat generating resistor element in said group measured after the impression of said at least one voltage pulse is higher than a predetermined resistance value, the apparatus further comprising:*

*means for comparing resistance values of heat generating resistor elements before and after a voltage pulse is applied to a heat generating resistor element;*

*means for disengaging the ohmmeter means from the heat generating resistor elements in the group in response to a determination that the resistance values are higher after application of a pulse; and*

*means for reengaging the ohmmeter means after a selected period of time.*

*23. A method of adjusting the resistance values of heat generating resistor elements of a thermal head assembly, said method characterized by the steps of:*

*A. measuring the initial resistance values of said heat generating resistor elements,*

*B. applying a first voltage pulse having a first peak voltage value to said heating generating resistor elements to decrease the initial resistance values of said heat generating resistor elements if the measured resistance values of said heating generating resistor elements are higher than a predetermined value,*

*C. measuring the resistance values of said heating generating elements,*

*D. applying a further voltage pulse having a further peak voltage value if the measured resistance values of said heating generating resistor elements are higher than said predetermined value, and*

*E. repeating Steps C and D with a sequence of voltage pulses wherein the peak voltage value of the voltage pulses in said sequence is increased in sequence, wherein the number of times the voltage pulses are applied is limited to a number less than a preset number.*

*24. A method of adjusting the resistance values of heat generating resistor elements of a thermal head assembly, said method characterized by the steps of:*

*A. measuring the initial resistance values of said heat gnerating resistor elements,*

*B. applying a first voltage pulse having a first peak voltage value to said heating generating resistor elements to decrease the initial resistance values of said heat generating resistor elements if the measured resistance values of said heating generating resistor elements are higher than a predetermined value, wherein the first peak voltage value is higher than a preselected*

*value, and wherein said preselected value is calculated based on the initial resistance values of said heat generating resistor elements,*

*C. measuring the resistance values of said heating generating elements,*

*D. applying a further voltage pulse having a further peak voltage value if the measured resistance values of said heating generating resistor elements are higher than said predetermined value, and*

*E. repeating Steps C and D with a sequence of voltage pulses wherein the peak voltage value of the voltage pulses in said sequence is increased in sequence.*

*25. A method of adjusting the resistance values of heat generating resistor elements of a thermal head assembly, said method characterized by the steps of:*

*A. measuring the initial resistance values of said heat generating resistor elements,*

*B. applying a first voltage pulse having a first peak voltage value to said heating generating resistor elements to decrease the initial resistance values of said heat generating resistor elements if the measured resistance values of said heating generating resistor elements are higher than a predetermined value,*

*C. measuring the resistance values of said heating generating elements,*

*D. applying a further voltage pulse having a further peak voltage value if the measured resistance values of said heating generating resistor elements are higher than said predetermined value, and*

*E. repeating Steps C and D with a sequence of voltage pulses wherein the peak voltage value of the voltage pulses in said sequence is increased in sequence,*

*wherein the pulses are applied with a pulse generating circuit and the resistance is measured by an ohmmeter means for heat generating resistor elements in a group, and wherein the step of measuring the resistance values comprises:*

*selectively connecting each heat generating resistorelement in the group to the pulse generating circuit and to the ohmmeter, and*

*inhibiting the pulse generating circuit from generating voltage pulses for a first predetermined time period commencing when the pulse generating circuit is connected to each heat generating resistor element in the group.*

*26. A method of adjusting the resistance values of heat generating resistor elements of a thermal head assembly, said method characterized by the steps of:*

*A. measuring the initial resistance values of said heat generating resistor elements,*

*B. applying a first voltage pulse having a first peak voltage value to said heating generating resistor elements to decrease the initial resistance values of said heat generating resistor elements if the measured resistance values of said heating generating resistor elements are higher than a predetermined value,*

*C. measuring the resistance values of said heating generating elements,*

*D. applying a further voltage pulse having a further peak voltage value if the measured resistance values of said heating generating resistor elements are higher than said predetermined value, and*

*repeating Steps C and D with a sequence of voltage pulses wherein the peak voltage value of the voltage pulses in said sequence is increased in sequence,*

*wherein the step of applying the first voltage pulse and the step of applying the further voltage pulse each comprise applying a predetermined number of pulses having the same voltage, the predetermined number being a number greater than 1.*

*27. A method of adjusting the resistance values of heat generating resistor elements of a thermal head assembly, said method characterized by the steps of:*

*A. measuring the initial resistance values of said heat generating resistor elements,*

*B. applying a first voltage pulse having a first peak voltage value to said heating generating resistor elements to decrease the initial resistance values of said heat generating resistor elements if the measured resistance values of said heating generating resistor elements are higher than a predetermined value,*

*C. measuring the resistance values of said heating generating elements,*

*D. applying a further voltage pulse having a further peak voltage value if the measured resistance values of said heating generating resistor elements are higher than said predetermined value, and*

*E. repeating Steps C and D with a sequence of voltage pulses wherein the peak voltage value of the voltage pulses in said sequence is increased in sequence,*

*F. determining how many times step E has been performed,*

*G. comparing the number of times step E has been performed with a predetermined limit, and*

*H. terminating the application of pulses when the limit is reached.*

*28. A method of adjusting the resistance values of heat generating resistor elements of a thermal head assembly, said method characterized by the steps of:*

*A. measuring the initial resistance values of said heat generating resistor elements,*

*B. applying a first voltage pulse having a first peak voltage value to said heating generating resistor elements to decrease the initial resistance values of said heat generating resistor elements if the measured resistance values of said heating generating resistor elements are higher than a predetermined value,*

*C. measuring the resistance values of said heating generating elements,*

*D. adjusting the width of the pulse,*

*E. applying a further voltage pulse having a further peak voltage value if the measured resistance values of said heating generating resistor elements are higher than said predetermined value, and*

*F. repeating Steps C–E with a sequence of voltage pulses wherein the peak voltage value of the voltage pulses in said sequence is increased in sequence.*

*29. A method of adjusting the resistance values of heat generating resistor elements of a thermal head assembly, said method characterized by the steps of:*

*A. measuring the initial resistance values of said heat generating resistor elements,*

*B. applying a first voltage pulse having a first peak voltage value to said heating generating resistor elements to decrease the initial resistance values of said heat generating resistor elements if the measured resistance values of said heating generating resistor elements are higher than a predetermined value,*

*C. measuring the resistance values of said heating generating elements,*

*D. applying a further voltage pulse having a further peak voltage value if the measured resistance values of said heating generating resistor elements are higher than said predetermined value, and*

*E. repeating Steps C and D with a sequence of voltage pulses wherein the peak voltage value of the voltage*

*pulses in said sequence is increased in sequence, the method further comprising the steps of:*

*comparing resistance values of heat generating resistor elements before and after a voltage pulse is applying to a heat generating resistor element,*

*disengaging the ohmmeter means from the heat generating resistor elements in the group in response to a determination that the resistance values are higher after application of a pulse, and*

*reengaging the ohmmeter means after a selected period of time.*

* * * * *